United States Patent
Zeng et al.

(10) Patent No.: US 10,991,579 B2
(45) Date of Patent: Apr. 27, 2021

(54) METHODS OF MAKING AND USING TIN OXIDE FILM WITH SMOOTH SURFACE MORPHOLOGIES FROM SPUTTERING TARGET INCLUDING TIN AND DOPANT

(71) Applicant: APPLIED MATERIALS, INC., Santa Clara, CA (US)

(72) Inventors: Weimin Zeng, San Jose, CA (US); Yong Cao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 111 days.

(21) Appl. No.: 16/400,850

(22) Filed: May 1, 2019

(65) Prior Publication Data
US 2019/0341248 A1 Nov. 7, 2019

Related U.S. Application Data

(60) Provisional application No. 62/665,655, filed on May 2, 2018.

(51) Int. Cl.
H01L 21/02 (2006.01)

(52) U.S. Cl.
CPC .. H01L 21/02554 (2013.01); H01L 21/02631 (2013.01)

(58) Field of Classification Search
CPC ............... H01L 21/02554; H01L 21/02631
See application file for complete search history.

(56) References Cited

U.S. PATENT DOCUMENTS

| | | | |
|---|---|---|---|
| 8,097,302 B2 | 1/2012 | Korotkov et al. | |
| 8,980,066 B2 | 3/2015 | Ye | |
| 2003/0175142 A1* | 9/2003 | Milonopoulou | C22C 1/0491 419/49 |
| 2008/0206923 A1 | 8/2008 | Kim et al. | |
| 2008/0261035 A1 | 10/2008 | Grimal et al. | |
| 2013/0164543 A1* | 6/2013 | Shibuya | G06F 3/044 428/428 |
| 2014/0174911 A1* | 6/2014 | Lang | H01J 37/34 204/192.12 |
| 2017/0352763 A1* | 12/2017 | Yamazaki | H01L 21/02554 |

OTHER PUBLICATIONS

"A Single target RF magnetron co-sputtered iron doped tin oxide films with pillars", Vacuum, No. 85, 2011, pp. 871-874. See pp. 872, 874. M. Kormunda et al.
International Search Report for PCT/US2019/030303, dated Aug. 16, 2019.

\* cited by examiner

*Primary Examiner* — Michael Jung
(74) *Attorney, Agent, or Firm* — Moser Taboada

(57) ABSTRACT

The present disclosure generally relates to tin oxide films prepared by physical vapor deposition using a doped tin target. The semiconductor film may include tin and oxygen, and may be formed in a PVD chamber including a silicon doped tin target. Additionally, the semiconductor film may be smooth compared to similarly formed films without a doped target. The semiconductor film may be deposited by applying an electrical bias to a sputtering silicon doped tin target including the silicon in an amount of 0.5 to 5% by atomic weight of the total target. The semiconductor film has a smooth surface morphology compared to similarly formed tin oxide films formed without a doped target.

19 Claims, 3 Drawing Sheets

METHODS OF MAKING AND USING TIN OXIDE FILM WITH SMOOTH SURFACE MORPHOLOGIES FROM SPUTTERING TARGET INCLUDING TIN AND DOPANT

CROSS-REFERENCE TO RELATED APPLICATIONS

This application claims priority to U.S. Provisional Application Ser. No. 62/665,655 filed on 2 May 2018, the contents of which are fully incorporated herein by reference.

FIELD

Embodiments of the present disclosure generally relate to a semiconductor material, and a method for depositing the semiconductor material.

BACKGROUND

Physical vapor deposition (PVD) is one of the most commonly used processes in fabrication of electronic devices. PVD is a plasma process performed in a vacuum chamber where a negatively biased target is exposed to a plasma of an inert gas having relatively heavy atoms (e.g., argon) or a gas mixture comprising such inert gas. Bombardment (or sputtering) of the target by ions of the inert gas results in ejection of atoms of the target material. The ejected atoms accumulate as a deposited film on a substrate placed on a substrate pedestal disposed underneath the target within the chamber.

The inventors have found that deposited film on the substrate, such as a tin oxide film, may have varied surface morphologies resulting in adverse effects in downstream processing such as lithography and etching. For example, during downstream photolithographic processing, a rougher surface of a deposited film may have a negative effect on the roughness of line sidewalls or cause higher line edge roughness (LER) or line width roughness (LWR) resulting in decreased device performance.

Therefore, the inventors have provided improved semiconductor processing methods and chamber components for forming one or more semiconductor layers such as tin oxide or tin rich tin oxide having substantially smooth surface morphologies.

SUMMARY

Methods and apparatus for depositing the semiconductor material are provided herein. In some embodiments, a method includes: flowing an oxygen containing gas and an inert gas into a physical vapor deposition processing chamber having a sputtering target including a tin and a dopant, wherein the dopant comprises 0.5% to 5% atomic percent of the sputtering target; applying an electrical bias to the sputtering target to sputter atoms from the sputtering target; and depositing a semiconductor layer on a substrate comprising the sputtered atoms, the semiconductor layer comprising the tin, the dopant, and the oxygen.

In some embodiments, a method includes flowing an oxygen containing gas and argon gas into a physical vapor deposition processing chamber having a sputtering target including a tin metal and a silicon dopant, wherein the silicon dopant comprises 0.5% to 5% atomic percent of the sputtering target; applying an electrical bias to the sputtering target to sputter atoms from the sputtering target; and depositing a semiconductor layer comprising the sputtered atoms on a substrate.

In some embodiments, a method includes forming a semiconductor layer including: flowing an oxygen containing gas and an inert gas into a physical vapor deposition processing chamber having a sputtering target including a tin metal and a silicon dopant, wherein the dopant comprises 0.5% to 5% atomic percent of the sputtering target; applying an electrical bias to the sputtering target; and depositing a semiconductor layer on a substrate, the semiconductor layer comprising tin oxide composition or tin rich tin oxide composition.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
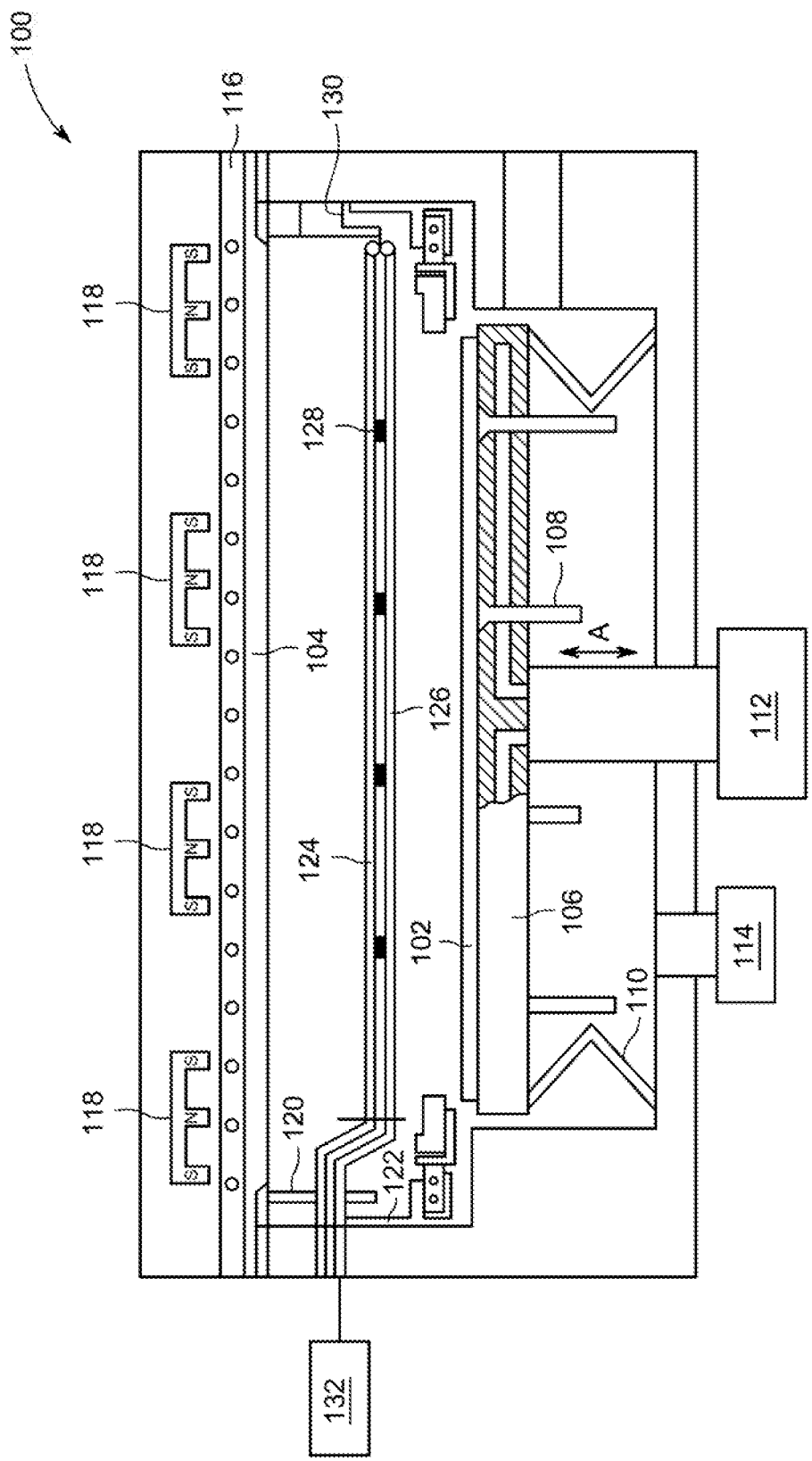
FIG. 1 is a schematic cross sectional view of a sputtering chamber that may be used to deposit the semiconductor film according to one embodiment of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of depositing a semiconductor layer are provided herein. For example the present disclosure relates to a sputtering method, including: flowing an oxygen containing gas and an inert gas into a physical vapor deposition processing chamber having a sputtering target including tin and a dopant, wherein the dopant includes 0.5% to 5% atomic weight of the sputtering target; applying an electrical bias to the sputtering target to sputter atoms from the sputtering target; and depositing a semiconductor layer on a substrate including the sputtered atoms. The methods and apparatus of the present disclosure are advantageous in that they provide very smooth surfaced semiconductor films such as tin oxide films deposited by a PVD process. The films are advantageous in providing smooth surface morphology and facilitating downstream processing such as lithography and etching. For example, during downstream photolithographic processing, a smoother surface of a deposited film may have a positive effect on reducing roughness of line sidewalls or cause lower line edge roughness (LER) or line width roughness (LWR) resulting in increased device performance, or lower lithographic dosing requirements.

In some embodiments, a reactive sputtering method is described and may be practiced in a PVD chamber for processing substrates, such as a PVD chamber, available from Applied Materials, Inc., of Santa Clara, Calif. However, because the semiconductor layer or film produced according to the method may be determined by the semiconductor layer structure and composition, the reactive sputtering method may have utility in other system configurations, including systems produced by other manufacturers. While the present disclosure is illustratively described below as deposited by PVD, other methods including chemical vapor deposition (CVD), atomic layer deposition (ALD), or spin-on processes may be utilized to deposit the semiconductor layers or films of the present disclosure.

FIG. 1 is a cross-sectional schematic view of a PVD chamber 100 according to one embodiment of the present disclosure. The PVD chamber 100 may be evacuated by a vacuum pump 114. Within the PVD chamber 100, a substrate 102 may be disposed opposite a target 104. In some embodiments, the substrate 102 may include plastic, paper, polymer, glass, stainless steel, silicon, germanium, silicon-germanium and combinations thereof. When the substrate is plastic, the reactive sputtering may occur at temperatures below about 180° C. In embodiments, substrate 102 may include silicon wafers, glass substrates, soda lime glass substrates, plastic substrates, etc. The substrate 102 may comprise any shape or size such as 200 mm wafers, 300 mm wafers, 400 mm wafers, flat panel substrates, polygonal substrates, roll-to-roll substrates, etc.

Still referring to FIG. 1, the substrate 102 may optionally be disposed on a susceptor 106 within the PVD chamber 100. The susceptor 106 may be elevated and lowered as shown by arrows "A" by an actuator 112. The susceptor 106 may be elevated to raise the substrate 102 to a processing position and lowered so that the substrate 102 may be removed from the PVD chamber 100. Lift pins 108 elevate the substrate 102 above the susceptor 106 when the susceptor 106 is in the lowered position. Grounding straps 110 may ground the susceptor 106 during processing. The susceptor 106 may be raised during processing to aid in uniform deposition. The temperature of the susceptor 106 may be maintained within a range of about room temperature to about 400° C. In one embodiment, the temperature of the susceptor 106 may be maintained between about 25° C. and about 250° C. In embodiments, the temperature of the PVD chamber 100 may be maintained within a range of about room temperature to about 400° C., or in embodiments, about 25° C. to about 400° C. In one embodiment, the temperature of PVD chamber 100 may be maintained between about 25° C. and about 250° C. In some embodiments, the PVD chamber 100 is at a temperature of about 16° C. to 25° C. In some embodiments, the PVD chamber 100 is at room temperature. In embodiments, an anode 124 may be placed between the target 104 and the substrate 102.

In some embodiments, the target 104 may include one or more targets 104 such as a sputtering target. In one embodiment, the target 104 may include a large area sputtering target. In another embodiment, the target 104 may comprise a plurality of tiles. In yet another embodiment, the target 104 may comprise a plurality of target strips. In still another embodiment, the target 104 may comprise one or more cylindrical, rotary targets. The target 104 may be bonded to a backing plate 116 by a bonding layer (not shown). One or more magnetrons 118 may be disposed behind the backing plate 116. In embodiments, the magnetrons 118 may scan across the backing plate 116 in a linear movement or in a two dimensional path. The walls of the chamber may be shielded from deposition by a dark space shield 120 and a chamber shield 122.

In embodiments, the target 104 such as a sputtering target may comprise, consists essentially of, or consist of tin and one or more dopants. The inventors have found the amount of dopant affects the morphology or surface roughness of the deposited film. In some embodiments, the ratio of a silicon dopant to the tin in the target may affect the smoothness and morphology of the semiconductor film. For example small amounts of silicon compared to tin in the target promotes smooth and substantially smooth semiconductor layer formation. For example, target 104 may comprise or consists essentially of tin and a silicon dopant. The dopant, such as silicon, may be present in an amount of between about 0.5% to 5% (atomic percentage) of the total target composition, or between 0.5% to 5% (atomic percentage) of the total target composition, or between about 1% to about 5% (atomic percentage) of total target composition, or between 1% to about 5% (atomic percentage) of total target composition, or about 1%, 2%, 3%, 4% or 5% (atomic percentage) of target composition. Atomic percentage as expressed herein may be converted to percent by weight of the total target composition. In some embodiments where there is an atomic percentage of silicon, the remaining percentage of the target may be tin. In some embodiments, the present disclosure provides target 104 configured for use in a PVD chamber as described herein. In some embodiments, the present disclosure provides a PVD chamber 100 including one or more targets 104 as described herein.

In some embodiments, to promote uniform sputtering deposition across a substrate 102, an anode 124 may be placed between the target 104 and the substrate 102. In one embodiment, the anode 124 may be bead blasted stainless steel coated with arc sprayed aluminum. In one embodiment, one end of the anode 124 may be mounted to the chamber wall by a bracket 130. The anode 124 provides a charge in opposition to the target 104 so that charged ions will be attracted thereto rather than to the chamber walls which are typically at ground potential. By providing the anode 124 between the target 104 and the substrate 102, the plasma may be more uniform, which may aid in the deposition. To reduce flaking, a cooling fluid may be provided through the one or more anodes 124. By reducing the amount of expansion and contraction of the anodes 124, flaking of material from the anodes 124 may be reduced. For smaller substrates and hence, smaller processing chambers, the anodes 124 spanning the processing space may not be necessary as the chamber walls may be sufficient to provide a path to ground and a uniform plasma distribution.

In embodiments, the reactive sputtering process may include disposing a sputtering target as described above opposite a substrate in a sputtering chamber. The sputtering target may substantially include tin, and comprise a dopant such as silicon in amounts sufficient to form a substantially smooth semiconductor layer. In embodiments, the semiconductor layer may also be annealed after depositing.

In some reactive sputtering embodiments, one or more gases such as a reactive gas may be provided into the PVD chamber 100. In embodiments, one or more gas introduction tubes 126 may span the distance across the PVD chamber 100 between the target 104 and the substrate 102. In embodiments, the gas introduction tubes 126 may introduce sputtering gases from a gas panel 132. The gas introduction tubes 126 may be coupled with the anodes 124 by one or more couplings 128. The coupling 128 may be made of thermally conductive material to permit the gas introduction tubes 126 to be conductively cooled. Additionally, the coupling 128 may be electrically conductive as well so that the gas introduction tubes 126 are grounded and function as anodes.

In some embodiments, during the sputtering process, inert gas such as argon, and an oxygen containing gas may be provided to the chamber for reactive sputtering of the target 104. In one embodiment, the oxygen containing gas comprises or consists of $O_2$. In embodiments, the oxygen of the oxygen containing gas react with the sputtering target to form a semiconductor material comprising metal, oxygen, and optionally a dopant such as silicon on the substrate. In one embodiment, the inert gas such as argon and the oxygen containing gas are separate gases. In another embodiment, the inert gas such as argon and the oxygen containing gas include the same gas. In some embodiments, the inert gas such as argon gas is provided at a flow rate between 1 to 200 sccm, 10 to 100 sccm, or 20 to 60 sccm. In some embodiments the oxygen containing gas or oxygen gas is provided at a flow rate & between 1 to 200 sccm, 10 to 100 sccm, or 20 to 60 sccm. In one embodiment, argon gas flow rate is about 60 sccm, and the oxygen flow rate is about 5 sccm. In one embodiment, inert gas such as argon gas flow rate is about 60 sccm, and the oxygen flow rate is about 5 sccm.

In some embodiments, the reactive sputtering process as described herein forms semiconductor layers on the surface of the substrate. In embodiments, a doped tin target is suitable for forming a semiconductor layer such as a tin oxide or tin rich tin oxide semiconductor layer. To produce a coating of the tin oxide or tin rich tin oxide on a substrate, the semiconductor layer is typically formed by sputtered the target described above onto a substrate under the conditions described herein. In some embodiments, one or more semiconductor layers such as tin oxide layer or tin rich tin oxide layer is in the form of a sheet or foil having a suitable thickness, such as, a thickness of or less than 1 mm, 0.5 mm, 0.1 mm, 0.05 mm, 0.01 mm, or 0.001 mm, or 100 angstrom or 50 angstrom or a range between any two of these values. Alternatively, the foregoing thicknesses describe the thickness of a tin oxide or tin rich tin oxide coating on a substrate. In some embodiments, the semiconductor layer may include a mixture of silicon, tin and oxygen, or a mixture of silicon-doped tin oxide (TSO). Other non-limiting examples of semiconductor layers include layers deposited as films including $SnO_x$, tin oxide, tin rich tin oxide, tin dioxide, and combinations thereof. In some embodiments, the semiconductor deposited film may include a tin oxide or composition characterized as $Sn_xO_y$. In embodiments, x and y are numbers such as decimals, or integers. In another embodiment, the semiconductor film may include a first tin oxide compound and a second tin oxide compound.

While the semiconductor layer or film is described as being deposited by sputtering a tin target including a dopant, other deposition methods may be utilized. In one embodiment, the sputtering target in accordance herewith may be biased with an RF current. In embodiments, DC current may be applied to the target. In some embodiments, power is applied to the sputtering target in an amount of about 1 to about 500 KW. In some embodiments, sputtering a tin target doped with silicon includes sputtering for about 20 to 360 seconds while a DC bias of 1 to about 400 KW was applied to the sputtering target. In some embodiments sputtering a tin target doped with silicon as described herein includes sputtering for up to 360 seconds while a DC bias of up to 500 KW was applied to the sputtering target. Argon may introduced to the processing chamber at a flow rate of up to about 100 sccm, and oxygen may be introduced at a flow rate of up to about 30 sccm. In embodiments, a semiconductor layer having a thickness of 100 angstroms may be formed by sputtering for a duration of 20 seconds to 2 minutes, or about 60 seconds, or 60 seconds.

In some embodiments, argon containing gas to oxygen containing gas flow ratios of about 1:1 to about 10:1 may produce semiconductor films with smoothness sufficient to reduce an EUV lithography dose by 5-10% during EUV lithographic patterning. In one embodiment, the argon containing gas to oxygen containing gas flow ratios may be between about 5:1 to about 10:1.

In embodiments, by controlling the proportionate amount of oxygen gas flow relative to the amount of inert gas such as argon, the RMS value and smoothness of the deposited semiconductor layer may be controlled. When increasing the amount of oxygen supplied relative to the inert gas such as argon, the RMS value may be increased. A lower RMS value may be desirable for the semiconductor layer of the present disclosure. In embodiments, the morphology of the deposited semiconductor layer in accordance with the present disclosure on a substrate can be tested using a multi-mode atomic force microscope (MM-AFM) and accompanying hardware. In embodiments, RMS output is a suitable indicator of roughness or smoothness. For example, as described in ASME B46.1, RMS is the root mean square average of the profile height deviations from the mean line, recorded within the evaluation length. The deposited semiconductor film in accordance with the present disclosure may have an RMS value in the amount of 0.1 to 0.4 nanometers at room temperature and a thickness of 100 angstrom. In embodiments, having an RMS value in the amount of 0.1 to 0.4 nanometers at room temperature and a thickness of 100 angstrom indicates the deposited material is substantially smooth in accordance with the present disclosure. In embodiments, having an RMS value in the amount of 0.2 to 0.3 nanometers at room temperature and a thickness of 100 angstrom indicates the deposited material is substantially smooth in accordance with the present disclosure. In embodiments, having an RMS value in the amount of 0.20 to 0.25 nanometers at room temperature and a thickness of 100 angstrom indicates the deposited material is substantially smooth in accordance with the present disclosure. However, other methods of measuring surface roughness may include roughness measured by manual comparison against a "surface roughness comparator" (a sample of known surface roughness).

Figure 2:
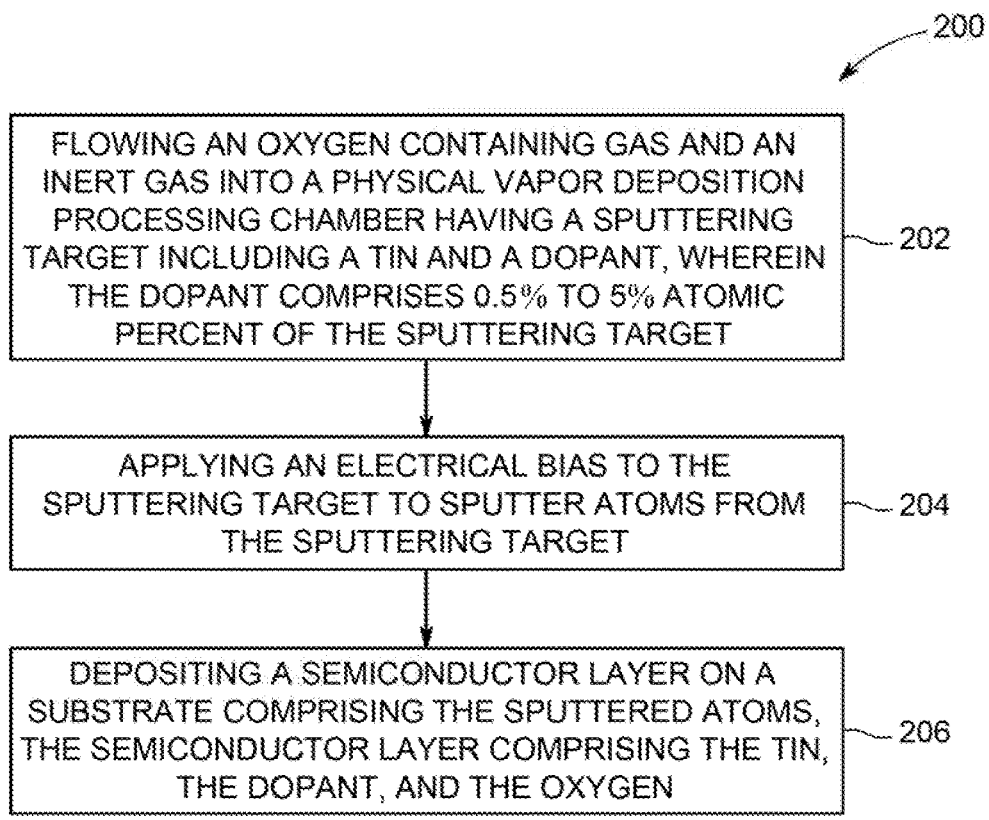
FIG. 2 is a flow chart of a sputtering method in accordance with some embodiments of the present disclosure.

Referring now to FIG. 2, a sputtering method 200, includes: 202 flowing an oxygen containing gas and an inert gas into a physical vapor deposition processing chamber having a sputtering target including a tin and a dopant, wherein the dopant comprises 0.5% to 5% atomic percent of the sputtering target; 204 applying an electrical bias to the sputtering target; and 206 depositing a semiconductor layer on a substrate, the semiconductor layer including or consisting of the tin, the dopant, and the oxygen.

In embodiments, the semiconductor layer comprises or consists of tin oxide, $SnO_x$, or tin dioxide. In some embodiments, the dopant comprises or consists of silicon. In some embodiments, at least a portion of the semiconductor layer comprises a tin oxide compound and a silicon compound. In some embodiments, the semiconductor layer has a substantially smooth surface morphology. In embodiments, the oxygen containing gas and the inert gas are separate gases. In some embodiments, the physical vapor deposition processing chamber is at a temperature of about 16° C. to 25° C., and a pressure of about 3 to 6 milliTorr.

Figure 3:
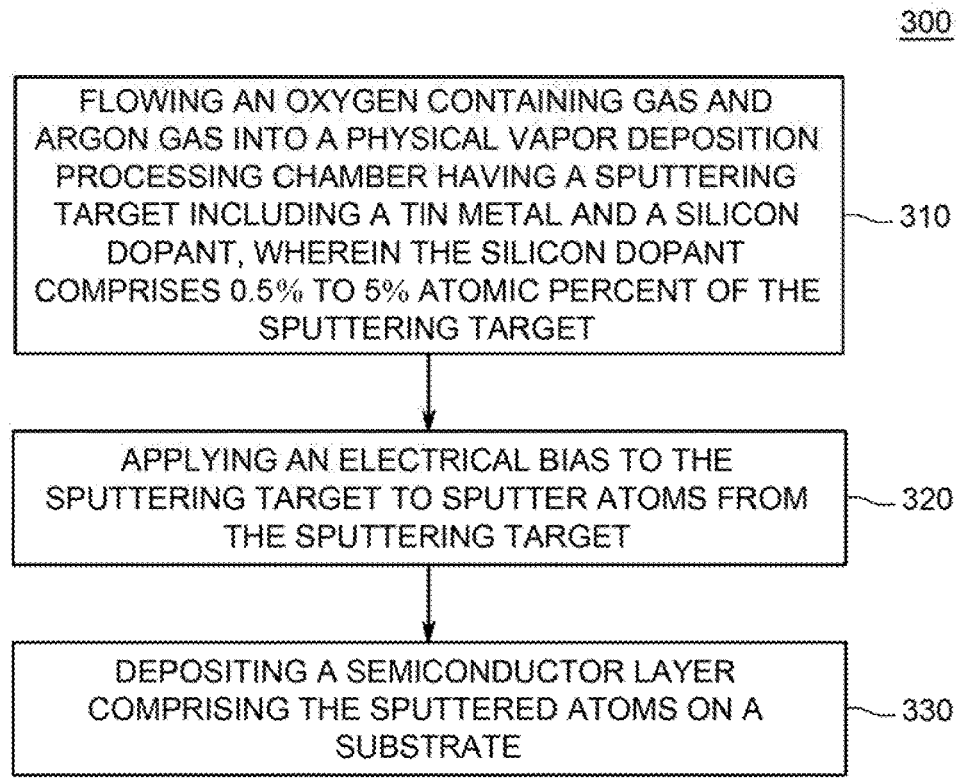
FIG. 3 is a flow chart of a method of sputtering in accordance with some embodiments of the present disclosure.

In embodiments, a sputtering method includes the method shown in FIG. 3. In some embodiments, sputtering methods include at process sequence 310: flowing an oxygen containing gas and argon gas into a physical vapor deposition processing chamber having a sputtering target including a tin metal and a silicon dopant, wherein the silicon dopant comprises 0.5% to 5% atomic percent of the sputtering target, and subsequently, at process sequence 320 applying an electrical bias to the sputtering target. In some embodiments, the methods include at process sequence 330, depositing a semiconductor layer on a substrate. In some embodiments, the silicon dopant comprises 0.5 to 4.0 atomic percent of the sputtering target. In some embodiments, the silicon dopant comprises 0.5 to 3.0 atomic percent of the entire sputtering target. In some embodiments, the silicon dopant comprises 0.5 to 2.0 atomic percent of the sputtering target. In some embodiments, the silicon dopant comprises 0.5 to 1.0 atomic percent of the sputtering target.

Figure 4:
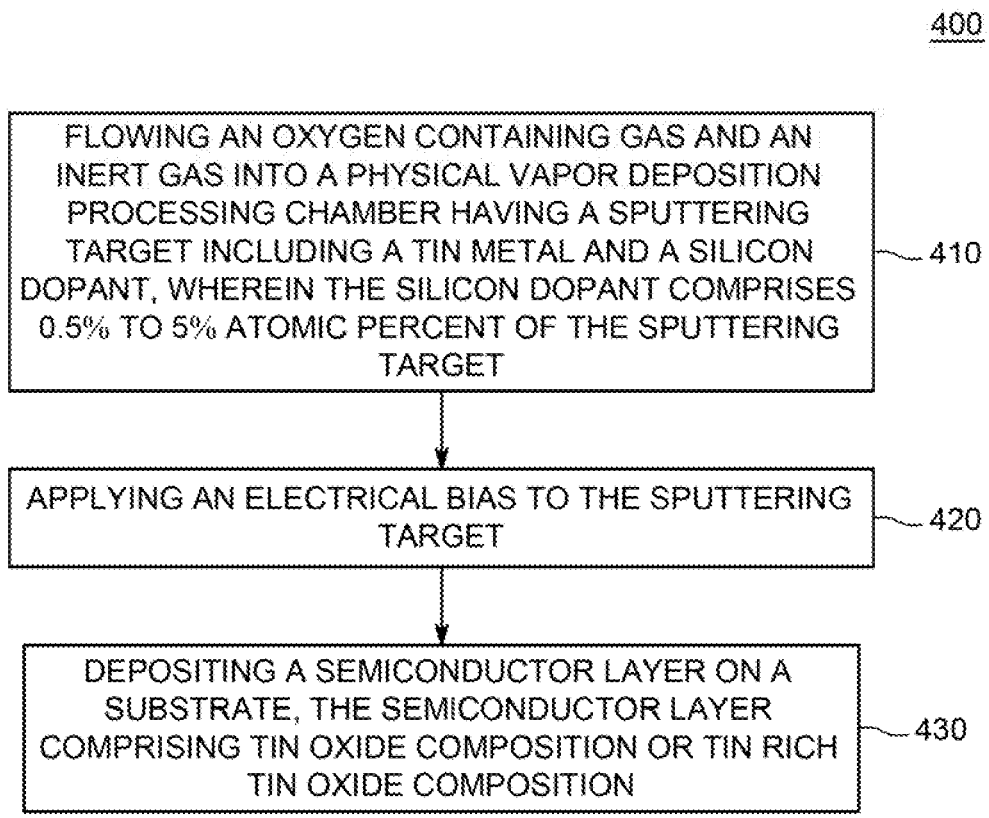
FIG. 4 is a flow chart of a method of forming a semiconductor layer in accordance with some embodiments of the present disclosure.

In some embodiments, a method of forming a semiconductor layer is provided as shown in FIG. 4. The method 400 includes, at 410 flowing an oxygen containing gas and an inert gas into a physical vapor deposition processing chamber having a sputtering target including a tin metal and a silicon dopant, wherein the dopant comprises 0.5% to 5% atomic percent of the sputtering target. Method 400 includes at process sequence 420 applying an electrical bias to the sputtering target. Method 400 includes at process sequence 430 depositing a semiconductor layer on a substrate, the semiconductor layer comprising tin oxide composition or tin rich tin oxide composition. In some embodiments, the semiconductor layer consists of tin oxide composition or tin rich tin oxide composition.

In some embodiments, a method includes: flowing an oxygen containing gas and an inert gas into a physical vapor deposition processing chamber having a sputtering target including a tin and a dopant, wherein the dopant comprises 0.5% to 5% atomic percent of the sputtering target; applying an electrical bias to the sputtering target to sputter atoms from the target; and depositing a semiconductor layer on a substrate comprising the sputtered atoms, the semiconductor layer comprising the tin, the dopant, and the oxygen.

In some embodiments, a method includes flowing an oxygen containing gas and argon gas into a physical vapor deposition processing chamber having a sputtering target including a tin metal and a silicon dopant, wherein the silicon dopant comprises 0.5% to 5% atomic percent of the sputtering target; applying an electrical bias to the sputtering target to sputter atoms from the target; and depositing a semiconductor layer comprising the sputtered atoms on a substrate. For example, referring to FIG. 3, method 300 relating to a sputtering method includes at process sequence 310 flowing an oxygen containing gas and argon gas into a physical vapor deposition processing chamber having a sputtering target including a tin metal and a silicon dopant, wherein the silicon dopant comprises 0.5% to 5% atomic percent of the sputtering target. The process sequence further includes at 320 applying an electrical bias to the sputtering target to sputter atoms from the sputtering target. The process sequence further includes at 330, depositing a semiconductor layer comprising the sputtered atoms on a substrate. In embodiments, the semiconductor layer has a substantially smooth surface morphology. In embodiments, the oxygen containing gas and the argon gas are separate gases. In embodiments, the physical vapor deposition processing chamber is at a temperature of about 16° C. to 25° C. In embodiments, the physical vapor deposition processing chamber is at a pressure of about 3 to 6 milliTorr. In embodiments, power is applied to the sputtering target in an amount of about 1 to about 500 KW.

Referring back to FIG. 1, the processing chamber can be controlled by a microprocessor controller (not shown). The microprocessor controller may be one of any form of general purpose computer processor or central processing unit (CPU) that can be used in an industrial setting for controlling various chambers and sub-processors. The computer processor may use any suitable memory, such as random access memory, read only memory, floppy disc drive, hard disk, or any other form of digital storage, local or remote. Various support circuits may be coupled to the CPU for supporting the processor in a conventional manner. Software routines, as required, may be stored in the memory or executed by a second CPU that is remotely located.

The software routines are executed after the substrate is positioned on the substrate support. The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

In another embodiment, a non-transitory computer readable medium is provided having instructions stored thereon that, when executed, cause a sputtering method such as e.g., a deposition in accordance with the present disclosure. For example, in embodiments, a non-transitory computer readable medium is provided having instructions stored thereon that, when executed, cause a sputtering method, including flowing an oxygen containing gas and an inert gas into a physical vapor deposition processing chamber having a sputtering target including a tin and a dopant, wherein the dopant comprises 0.5% to 5% atomic percent of the sputtering target; applying an electrical bias to the sputtering target to sputter atoms from the sputtering target; and depositing a semiconductor layer on a substrate comprising the sputtered atoms, the semiconductor layer comprising or consisting of the tin, the dopant, and the oxygen.

In embodiments, the present disclosure includes a non-transitory computer readable medium having instructions stored thereon that, when executed, cause a sputtering method, including flowing an oxygen containing gas and argon gas into a physical vapor deposition processing chamber having a sputtering target including a tin metal and a silicon dopant, wherein the silicon dopant comprises 0.5% to 5% atomic percent of the sputtering target; applying an electrical bias to the sputtering target to sputter atoms from the sputtering target; and depositing a semiconductor layer comprising the sputtered atoms on a substrate.

In embodiments, the present disclosure includes a non-transitory computer readable medium having instructions stored thereon that, when executed, cause a method of forming a semiconductor layer, including: flowing an oxygen containing gas and an inert gas into a physical vapor deposition processing chamber having a sputtering target including a tin metal and a silicon dopant, wherein the silicon dopant comprises 0.5% to 5% atomic percent of the sputtering target; applying an electrical bias to the sputtering target; and depositing a semiconductor layer on a substrate, the semiconductor layer comprising tin oxide composition or tin rich tin oxide composition.

While the foregoing is directed to embodiments of the present disclosure, other and further embodiments of the disclosure may be devised without departing from the basic scope thereof.

The invention claimed is:

1. A sputtering method, comprising:
   flowing an oxygen containing gas and an inert gas into a physical vapor deposition processing chamber having a sputtering target including a tin and a dopant, wherein the dopant comprises 0.5% to 5% atomic percent of the sputtering target;
   applying an electrical bias to the sputtering target to sputter atoms from the sputtering target; and
   depositing a semiconductor layer on a substrate comprising the sputtered atoms, the semiconductor layer comprising the tin, the dopant, and the oxygen,
   wherein at least a portion of the semiconductor layer comprises a tin oxide compound and a silicon compound.

2. The method of claim 1, wherein the semiconductor layer comprises the dopant tin oxide, $SnO_x$, tin rich tin oxide, or tin dioxide.

3. The method of claim 1, wherein the dopant is silicon.

4. The method of claim 1, wherein the semiconductor layer has a substantially smooth surface morphology having an RMS value in an amount of 0.1 to 0.4 nanometers.

5. The method of claim 1, wherein the oxygen containing gas and the inert gas are separate gases prior to mixing in the physical vapor deposition processing chamber.

6. The method of claim 1, wherein the physical vapor deposition processing chamber is at a temperature of 16° C. to 25° C.

7. The method of claim 1, wherein the physical vapor deposition processing chamber is at a pressure of 3 to 6 milliTorr.

8. The method of claim 1, wherein power is applied to the sputtering target in an amount of 1 to 500 KW.

9. A sputtering method, comprising:
   flowing an oxygen containing gas and argon gas into a physical vapor deposition processing chamber having a sputtering target including a tin metal and a silicon dopant, wherein the silicon dopant comprises 0.5% to 5% atomic percent of the sputtering target;
   applying an electrical bias to the sputtering target to sputter atoms from the sputtering target; and
   depositing a semiconductor layer comprising the sputtered atoms on a substrate,
   wherein at least a portion of the semiconductor layer comprises a tin oxide compound and a silicon compound.

10. The method of claim 9, wherein the semiconductor layer has a smooth surface morphology.

11. The method of claim 9, wherein the oxygen containing gas and the argon gas are separate gases.

12. The method of claim 9, wherein the physical vapor deposition processing chamber is at a temperature of 16° C. to 25° C.

13. The method of claim 9, wherein the physical vapor deposition processing chamber is at a pressure of 3 to 6 milliTorr.

14. The method of claim 9, wherein power is applied to the sputtering target in an amount of 1 to 500 KW.

15. A method of forming a semiconductor layer, comprising:
   flowing an oxygen containing gas and an inert gas into a physical vapor deposition processing chamber having a sputtering target including a tin metal and a silicon dopant, wherein the silicon dopant comprises 0.5% to 5% atomic percent of the sputtering target;
   applying an electrical bias to the sputtering target; and
   depositing a semiconductor layer on a substrate, the semiconductor layer comprising tin oxide composition or tin rich tin oxide composition and a silicon compound.

16. The method of claim 15, wherein the semiconductor layer has a smooth surface morphology.

17. The method of claim 15, wherein the oxygen containing gas and the inert gas are separate gases.

18. The method of claim 15, wherein the physical vapor deposition processing chamber is at a temperature of 16° C. to 25° C.

19. The method of claim 15, wherein the physical vapor deposition processing chamber is at a pressure of 3 to 6 milliTorr.

* * * * *